United States Patent
Nishita et al.

(10) Patent No.: US 12,087,576 B2
(45) Date of Patent: Sep. 10, 2024

(54) COMPOSITION FOR FORMING COATING FILM AND METHOD FOR MANUFACTURING SEMICONDUCTOR DEVICE

(71) Applicant: NISSAN CHEMICAL CORPORATION, Tokyo (JP)

(72) Inventors: Tokio Nishita, Toyama (JP); Rikimaru Sakamoto, Toyama (JP); Yasunobu Someya, Toyama (JP); Takahiro Kishioka, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 0 days.

(21) Appl. No.: 17/045,304

(22) PCT Filed: Apr. 2, 2019

(86) PCT No.: PCT/JP2019/014615
§ 371 (c)(1),
(2) Date: Oct. 5, 2020

(87) PCT Pub. No.: WO2019/194175
PCT Pub. Date: Oct. 10, 2019

(65) Prior Publication Data
US 2021/0151318 A1  May 20, 2021

(30) Foreign Application Priority Data
Apr. 6, 2018  (JP) .................. 2018-073623

(51) Int. Cl.
*H01L 21/02* (2006.01)
*C09D 7/20* (2018.01)
*H01L 23/29* (2006.01)

(52) U.S. Cl.
CPC .......... *H01L 21/02282* (2013.01); *C09D 7/20* (2018.01); *H01L 21/02164* (2013.01); *H01L 21/02318* (2013.01); *H01L 23/293* (2013.01)

(58) Field of Classification Search
None
See application file for complete search history.

(56) References Cited

U.S. PATENT DOCUMENTS

| | | | | |
|---|---|---|---|---|
| 2002/0071941 A1* | 6/2002 | Tsuchida | ................ | B41M 5/52 |
| | | | | 428/32.1 |
| 2011/0051245 A1* | 3/2011 | Masuda | ................ | G02B 1/04 |
| | | | | 359/584 |
| 2011/0241210 A1 | 10/2011 | Ono et al. | | |
| 2013/0108915 A1* | 5/2013 | Fukuda | ............. | H01M 50/172 |
| | | | | 429/176 |
| 2013/0109607 A1* | 5/2013 | Takayama | ............. | C23G 1/061 |
| | | | | 510/259 |
| 2013/0155145 A1 | 6/2013 | Gotou et al. | | |
| 2013/0172523 A1* | 7/2013 | Sato | ............. | C08G 75/00 |
| | | | | 528/382 |
| 2015/0258833 A1* | 9/2015 | Katsuragi | ............. | C09D 11/40 |
| | | | | 347/21 |
| 2016/0049343 A1 | 2/2016 | Kayaba et al. | | |
| 2019/0003062 A1* | 1/2019 | Matsumoto | ............. | H05K 3/383 |
| 2019/0004224 A1* | 1/2019 | Kimura | ............. | G02B 5/26 |
| 2019/0111659 A1* | 4/2019 | Hatazawa | ............. | B32B 27/34 |

FOREIGN PATENT DOCUMENTS

| | | | |
|---|---|---|---|
| JP | 2009108433 A | * | 5/2009 |
| JP | 2010-272402 A | | 12/2010 |
| JP | 2011-29422 A | | 2/2011 |
| JP | 2012-28237 A | | 2/2012 |
| JP | 2013-123852 A | | 6/2013 |
| JP | 2017-71662 A | | 4/2017 |

(Continued)

OTHER PUBLICATIONS

Machine language translation of JP 2009-108433-A (Year: 2009).*
International Search Report (PCT/ISA/210) issued in PCT/JP2019/014615, dated Jul. 2, 2019.
Kayaba et al., "pH-Dependent Selective Thickness Control of Polyelectrolyte Nanolayers on SiO2 and Cu Surfaces," The Journal of Physical Chemistry C, vol. 119, 2015, pp. 22882-22888.
Written Opinion of the International Searching Authority (PCT/ISA/237) issued in PCT/JP2019/014615, dated Jul. 2, 2019.

*Primary Examiner* — Erik Kielin
(74) *Attorney, Agent, or Firm* — Birch, Stewart, Kolasch & Birch, LLP

(57) ABSTRACT

Provided are: a composition for forming a coating film, the composition comprising (a) a polymer containing a structural unit represented by formula (1a) or (1b), and (b) a solvent including 51-99 mass % of water and 1-49 mass % of at least one organic solvent selected from the group consisting of propylene glycol monomethyl ether, propylene glycol monomethyl ether acetate, propylene glycol monoethyl ether, methyl 2-hydroxyisobutyrate, ethyl 3-ethoxypropionate, and ethyl lactate; and a method for manufacturing a semiconductor device using the same.

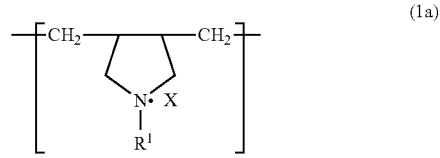

(1a)

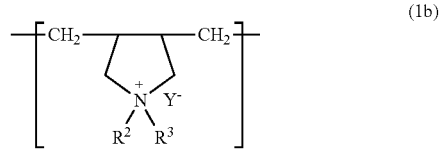

(1b)

3 Claims, No Drawings

(56) References Cited

FOREIGN PATENT DOCUMENTS

WO     WO2010/137711 A1    12/2010
WO     WO 2014/156616 A1   10/2014

* cited by examiner

COMPOSITION FOR FORMING COATING FILM AND METHOD FOR MANUFACTURING SEMICONDUCTOR DEVICE

TECHNICAL FIELD

The present invention relates to a composition for forming a coating film and a method for manufacturing a semiconductor device.

BACKGROUND ART

In the field of semiconductor devices of which miniaturization progresses, it has been proposed to form a resin layer in order to prevent diffusion of a metal component such as copper embedded as a wiring material into an interlayer insulating layer of a semiconductor (Patent Document 1). However, it is required to prevent the resin layer from being formed on the wiring and to maintain electrical connection on a surface of the wiring. Non-Patent Document 1 describes that an organic film can selectively be formed on $SiO_2$ using a composition containing polyethyleneimine and having a pH adjusted with formic acid.

PRIOR ART DOCUMENTS

Patent Documents

Patent Document 1: WO 2010/137711

Non-Patent Documents

Non-Patent Document 1: J. Phys. Chem. C 2015, 119, 22882-22888

SUMMARY OF INVENTION

Technical Problem

In the technique described in Non-Patent Document 1, it is necessary to add formic acid as a pH adjuster to the composition. Formic acid is designated as a deleterious substance in the Poisonous and Deleterious Substances Control Law in Japan, so the use of materials containing formic acid is not suitable for industrialization.

The present invention has been made in view of the above circumstances, and an object thereof is to provide a composition for forming a coating film which can be used to selectively form a coating film on an insulating layer typified by silicon oxide on a substrate having a wiring layer containing copper and the insulating layer without using a chemical substance such as formic acid whose use is restricted, and a method for manufacturing a semiconductor device using the same.

Solution to Problem

As a result of repeated intensive studies to achieve the object, the present inventors have found that the problem can be solved by a composition containing a predetermined diallylamine-based polymer and a solvent mixture of a predetermined organic solvent and water, and completed the present invention.

Specifically, the present invention provides the following composition for forming a coating film and the following method for manufacturing a semiconductor device.

1. A composition for forming a coating film, containing:
   (a) a polymer containing a structural unit represented by the following formula (1a) or (1b); and
   (b) a solvent containing 1 to 49% by weight of at least one organic solvent selected from the group consisting of propylene glycol monomethyl ether, propylene glycol monomethyl ether acetate, propylene glycol monoethyl ether, methyl 2-hydroxyisobutyrate, ethyl 3-ethoxypropionate and ethyl lactate and 51 to 99% by weight of water:

[Chem. 1]

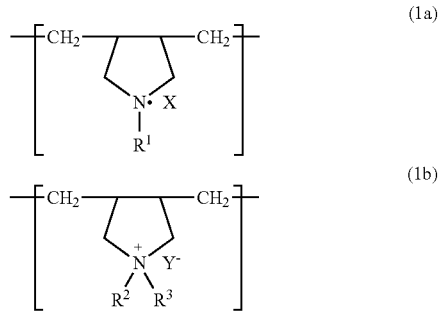

wherein X is acetic acid, propionic acid, sulfamic acid, or hydrogen halide, $Y^-$ is a hydrogen sulfate ion, a methyl sulfate ion, an ethyl sulfate ion, or a halide ion, $R^1$ is a hydrogen atom or a methyl group, and $R^2$ and $R^3$ are each independently a methyl group or an ethyl group.

2. The composition for forming a coating film according to 1, wherein the polymer further contains a structural unit represented by the following formula (2).

[Chem. 2]

3. The composition for forming a coating film according to 1 or 2, wherein the (b) solvent contains 1 to 30% by weight of the organic solvent and 70 to 99% by weight of water.

4. A method for manufacturing a semiconductor device, including the steps of:
   applying the composition for forming a coating film according to any one of 1 to 3 to surfaces of an insulating layer and a wiring layer containing copper on a substrate on which the insulating layer and the wiring layer are formed, and then baking the composition to form a coating film; and
   selectively removing the coating film on the wiring layer using water.

5. The method for manufacturing a semiconductor device according to 4, wherein the insulating layer contains $SiO_2$ as a principal component.

6. The method for manufacturing a semiconductor device according to 4 or 5, wherein the insulating layer contains porous silica as a principal component and has a silanol residue derived from the porous silica on a surface thereof.

Advantageous Effects of Invention

The composition for forming a coating film according to the present invention is free of a chemical substance such as formic acid whose use is restricted, and thus can be industrially used. Further, the composition for forming a coating film according to the present invention can be used to selectively form a coating film on the insulating layer by a simple method.

DESCRIPTION OF EMBODIMENTS

[(a) Component]

The (a) component of the composition for forming a coating film according to the present invention is a diallylamine-based polymer and contains a structural unit represented by the following formula (1a) or (1b).

[Chem. 3]

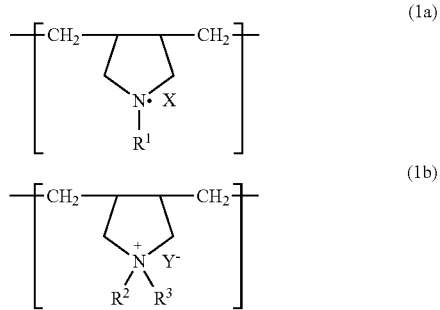

In formula (1a), X is acetic acid, propionic acid, sulfamic acid, or hydrogen halide. Examples of the hydrogen halide include hydrogen chloride, hydrogen bromide, and hydrogen iodide. X is preferably acetic acid or sulfamic acid.

In formula (1b), $Y^-$ is a hydrogen sulfate ion, a methyl sulfate ion, an ethyl sulfate ion, or a halide ion. Examples of the halide ion include a chloride ion, a bromide ion, and an iodide ion. $Y^-$ is preferably an ethyl sulfate ion.

In formula (1a), $R^1$ is a hydrogen atom or a methyl group. In formula (1b), $R^2$ and $R^3$ are each independently a methyl group or an ethyl group.

Preferably, the polymer further contains a structural unit represented by the following formula (2).

[Chem. 4]

When the polymer is a copolymer having structural units represented by formula (1a) or (1b) and structural units represented by formula (2), the copolymer may be an alternating copolymer in which the structural units represented by formula (1a) or (1b) and the structural units represented by formula (2) are alternately bonded, or a random copolymer in which these structural units are randomly bonded. Particularly preferably, the polymer is an alternating copolymer.

The polymer may have structural units other than the above-described structural units (hereinafter referred to as other structural units). Examples of such other structural units include those derived from (meth)acrylamide; those derived from monoallylamines such as allylamine, N-methylallylamine and N,N-dimethylallylamine; and those derived from acetic acid salts, hydrochloric acid salts, hydrobromic acid salts, and propionic acid, sulfamic acid and other acid addition salts of monoallylamines.

When the polymer as the (a) component is the copolymer described above, the content ratio (molar ratio) of the structural units represented by formula (1a) or (1b) to the structural units represented by formula (2) is preferably around in the range of 99/1 to 50/50, more preferably around in the range of 90/10 to 50/50, and even more preferably 50/50 or in the vicinity thereof. When the polymer has such other structural units, the content proportion thereof is usually 10 mol % or less in all the structural units, but preferably 5 mol % or less.

The weight average molecular weight (Mw) of the polymer as the (a) component is preferably 300 to 1,000,000, more preferably 500 to 500,000, even more preferably 800 to 100,000, and further preferably 1,000 to 50,000. In the present invention, the Mw of the polymer as the (a) component is a value measured by gel permeation chromatography (GPC) in terms of polyethylene glycol.

The polymer as the (a) component can be synthesized by a conventionally known method, or a commercially available product can be used. Examples of the commercial product include PAA-D11-HCL, PAA-D41-HCL, PAA-D19-HCL, PAA-D19A, PAS-21CL, PAS-M-1L, PAS-M-1, PAS-22SA-40, PAS-M-1A, PAS-H-1L, PAS-H-5L, PAS-H-10L, PAS-24, PAS-92, PAS-92A, PAS-2401, PAS-2201CL, PAS-A-1, PAS-A-5, PAS-2141CL, PAS-J-81L, PAS-J-81, PAS-J-41, and PAS-880 manufactured by NITTOBO MEDICAL CO., LTD.

The content of the (a) component in the composition of the present invention is preferably 0.1 to 20% by weight, and more preferably 1 to 5% by weight, from the viewpoint of film-forming properties.

[(b) Solvent]

The solvent as the (b) component contains 1 to 49% by weight of at least one organic solvent selected from the group consisting of propylene glycol monomethyl ether, propylene glycol monomethyl ether acetate, propylene glycol monoethyl ether, methyl 2-hydroxyisobutyrate, ethyl 3-ethoxypropionate and ethyl lactate, and 51 to 99% by weight of water. If the content of the organic solvent is less than 1% by weight, the coatability may decrease. If it exceeds 49% by weight, the solubility of the polymer as the (a) component may decrease.

The organic solvent is preferably propylene glycol monomethyl ether or propylene glycol monomethyl ether acetate, and more preferably propylene glycol monomethyl ether.

In the (b) solvent, the content of the organic solvent is preferably 1 to 30% by weight, more preferably 5 to 25% by weight, and even more preferably 10 to 20% by weight. The content of water is preferably 70 to 99% by weight, more preferably 75 to 95% by weight, and even more preferably 80 to 90% by weight.

[Other Components]

The composition of the present invention may contain components other than the above-described components (hereinafter referred to as other components) within a range in which the effects of the present invention are not impaired. Examples of such other components include various additives such as a surfactant. The surfactant is an additive for improving the coatability of the composition of the present invention onto the substrate. As the surfactant, known surfactants such as nonionic surfactants and fluorine surfactants can be used.

[Method for Manufacturing Semiconductor Device]

The method for manufacturing a semiconductor device of the present invention includes the steps of: applying the composition for forming a coating film described above to surfaces of an insulating layer and a wiring layer containing copper (hereinafter referred to as copper wiring layer) on a substrate on which the insulating layer and the copper wiring layer are formed, and then baking the composition to form a coating film; and selectively removing the coating film on the copper wiring layer using water.

Examples of the insulating layer include an insulating layer containing $SiO_2$ and an insulating layer containing a low-k material such as porous silica, SiOF, SiOC, hydrogenated silsesquioxane, or methylated silsesquioxane. Of these, the insulating layer is preferably one containing $SiO_2$ as a principal component, or one containing porous silica as a principal component and having a silanol residue derived from the porous silica on a surface thereof. In the present invention, the principal component means the component with the largest content ratio.

Examples of the substrate on which the insulating layer and the copper wiring layer are formed include a substrate obtained by forming copper wiring in a pattern formed in an insulating layer on a semiconductor substrate of silicon or the like by a method such as electrolytic plating, and planarizing the resultant product by chemical mechanical polishing (CMP). Further, examples of the substrate on which the insulating layer and the copper wiring layer are formed include those in which, after CMP, an insulating layer or the like is further provided to form a multilayer structure, and a trench or a via is formed therein.

The method for applying the composition for forming a coating film may be a conventionally known method, such as spin coating, cast coating, blade coating, dip coating, roll coating, bar coating, die coating, an inkjet method, and a printing method.

The composition for forming a coating film is applied to surfaces of the insulating layer and the copper wiring layer on the substrate and then baked to form a coating film. At this time, the baking temperature is preferably 50 to 300° C., and more preferably 70 to 250° C. The baking time is preferably 10 seconds to 10 minutes, and more preferably 30 seconds to 2 minutes.

The thickness of the resultant coating film is preferably 0.1 to 200 nm, and more preferably 1 to 100 nm.

After formation of the coating film, the coating film on the copper wiring layer is selectively removed using water. Examples of the method for removing the coating film include a method of applying water onto the coating film, and dissolving the coating film on the copper wiring layer to remove the coating film. At this time, the method for applying water is, for example, spin coating, cast coating, blade coating, dip coating, roll coating, bar coating, die coating, an inkjet method, or a printing method.

An organic film can selectively be formed on the surface of the insulating layer by the method described above. The organic film prevents diffusion of the metal component of the wiring from into the insulating layer, and also functions as a protective film for the insulating layer.

EXAMPLES

Hereinafter, the present invention is described in more detail with reference to a Synthesis Example and Examples, but is not limited to the following Examples.

Synthesis Example 1

Terephthalic acid diglycidyl ester (Denacol (registered trademark) EX711, manufactured by Nagase ChemteX Corporation) (5.00 g), 5-hydroxyisophthalic acid (manufactured by Tokyo Chemical Industry Co., Ltd.) (3.15 g), and benzyltriethylammonium chloride (manufactured by Tokyo Chemical Industry Co., Ltd.) (0.20 g) were added to and dissolved in propylene glycol monomethyl ether (35.60 g). After the reaction vessel was purged with nitrogen, the solution was reacted at 135° C. for 4 hours to yield a polymer solution. The polymer had good solubility in propylene glycol monomethyl ether, and the solution did not cause cloudiness or the like even when cooled to room temperature. GPC analysis (eluent: tetrahydrofuran, and calibration curve: standard polystyrene) showed that the polymer in the resultant solution had an Mw of 15,673 and dispersion of 3.39. The polymer obtained in this Synthesis Example had a structural unit represented by the following formula (3) and a structural unit represented by the following formula (4).

[Chem. 5]

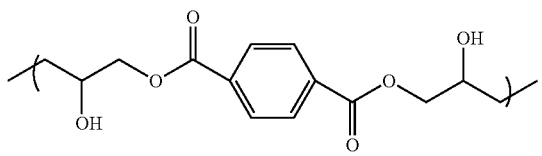

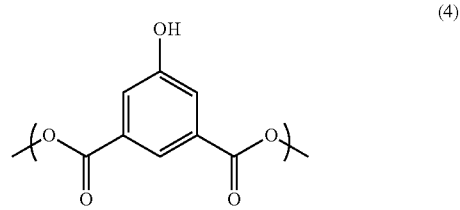

[1] Preparation of Composition for Forming Coating Film

Example 1-1

To 0.80 g of an aqueous solution containing 0.15 g of a diallylamine acetate/sulfur dioxide copolymer (PAS-92A, manufactured by NITTOBO MEDICAL CO., LTD.), 11.2 g of ultrapure water and 3 g of propylene glycol monomethyl ether were added to prepare a composition A for forming a coating film.

Comparative Example 1-1

To 1.3 g of the polymer solution containing 0.24 g of a polymer solid content obtained in Synthesis Example 1, 12.8 g of polyethylene glycol monomethyl ether and 5.9 g of propylene glycol monomethyl ether acetate were added to prepare a composition B for forming a coating film. The polymer contained in the composition B for forming a coating film of this Comparative Example does not correspond to the polymer having the structural unit represented by formula (1a) or (1b).

Comparative Example 1-2

To 0.80 g of an aqueous solution containing 0.15 g of a diallylamine acetate/sulfur dioxide copolymer (PAS-92A, manufactured by NITTOBO MEDICAL CO., LTD.), 14.2 g of ultrapure water was added to prepare a composition C for forming a coating film. The solvent contained in the composition C for forming a coating film of this Comparative Example has an organic solvent content of less than 1% by weight (0% by weight).

Comparative Example 1-3

To 0.80 g of an aqueous solution containing 0.15 g of a diallylamine acetate/sulfur dioxide copolymer (PAS-92A, manufactured by NITTOBO MEDICAL CO., LTD.), 6.8 g of ultrapure water and 7.4 g of propylene glycol monomethyl ether were added to prepare a composition for forming a coating film. However, in the composition for forming a coating film prepared in this Comparative Example, the polymer was precipitated. The solvent contained in the composition for forming a coating film of this Comparative Example has an organic solvent content of more than 49% by weight.

[2] Evaluation of Coating Film Formation $O_2$ ashing was performed on a substrate on which silicon oxide was vapor-deposited to a thickness of 300 nm (hereinafter referred to as $SiO_2$ substrate) using an etcher manufactured by Samco Inc. for 10 minutes. Thereafter, the resultant $SiO_2$ substrate was cut into a 3 cm square, which was used for evaluation of coatability onto the insulating layer. Further, the contact angle of water on the $SiO_2$ substrate was measured using a contact angle meter DM-701 (manufactured by Kyowa Interface Science, Inc.), and taken as the contact angle of water before film formation.

A substrate on which copper was vapor-deposited to a thickness of 100 nm (hereinafter referred to as Cu substrate) was immersed in a 0.5 mol/L sulfuric acid solution for 5 minutes, then washed with ultrapure water and dried. Thereafter, the resultant Cu substrate was cut into a 3 cm square, which was used for evaluation of coatability onto the wiring layer. Further, the contact angle of water on the Cu substrate was measured using a contact angle meter DM-701 (manufactured by Kyowa Interface Science, Inc.), and taken as the contact angle of water before film formation.

Example 2-1

The composition A for forming a coating film was applied onto the $SiO_2$ substrate and Cu substrate cut into a 3 cm square using a spin coater (manufactured by Brewer Science, Inc.), and baked for 60 seconds at 100° C. to form a coating film. Thereafter, ultrapure water was applied onto the coating film using a spin coater (manufactured by Brewer Science, Inc.) and held for 60 seconds. After removal of the coating film on the $SiO_2$ substrate and Cu substrate, the contact angle of water was measured using a contact angle meter DM-701 (Kyowa Interface Science, Inc.). The results are shown in Table 1.

Comparative Example 2-1

The composition B for forming a coating film was applied onto the $SiO_2$ substrate and Cu substrate cut into a 3 cm square using a spin coater (manufactured by Brewer Science, Inc.), and baked for 60 seconds at 100° C. to form a coating film. Then, propylene glycol monomethyl ether/propylene glycol monomethyl ether acetate (weight ratio of 7/3) were applied onto the coating film using a spin coater (manufactured by Brewer Science Co.) and held for 60 seconds. After removal of the coating film on the $SiO_2$ substrate and Cu substrate, the contact angle of water was measured using a contact angle meter DM-701 (manufactured by Kyowa Interface Science, Inc.). The results are shown in Table 1.

TABLE 1

|  | Before film formation | Example 2-1 | Comparative Example 2-1 |
|---|---|---|---|
| $SiO_2$ substrate | 36° | 42° | 35° |
| Cu substrate | 101° | 100° | 55° |

Example 2-2

The contact angle of water was measured by the same method as in Example 2-1, except that the baking temperature was 200° C. The results are shown in Table 2.

Comparative Example 2-2

The contact angle of water was measured by the same method as in Comparative Example 2-1, except that the baking temperature was 200° C. The results are shown in Table 2.

TABLE 2

|  | Before film formation | Example 2-2 | Comparative Example 2-2 |
|---|---|---|---|
| $SiO_2$ substrate | 37° | 69° | 62° |
| Cu substrate | 100° | 100° | 49° |

Comparative Example 2-3

The composition C for forming a coating film was attempted to be applied onto the $SiO_2$ substrate and Cu substrate by the above-described method, but could not uniformly be applied onto either of the substrates.

From Examples 2-1 and 2-2, it was demonstrated that, when the composition A for forming a coating film according to the present invention was used to form a coating film on the $SiO_2$ substrate, the contact angle was changed before and after formation of the coating film, and thus that the coating film was not removed by water and remained on the $SiO_2$ substrate. On the other hand, it was demonstrated that, when a coating film was formed on the Cu substrate, the contact angle was hardly changed before and after formation of the coating film, and thus that the coating film was removed by water.

From Comparative Examples 2-1 and 2-2, it was demonstrated that, when the composition B for forming a coating film was used to form a coating film on the Cu substrate, the contact angle was changed before and after formation thereof, and thus that the coating film was not removed by propylene glycol monomethyl ether/propylene glycol monomethyl ether acetate (weight ratio of 7/3) and remained on the Cu substrate. That is, it was demonstrated that the coating film obtained from the composition B for forming a coating film was not removed from the Cu substrate by propylene glycol monomethyl ether/propylene glycol monomethyl ether acetate (weight ratio of 7/3).

From the above results, it was demonstrated that a coating film can selectively be formed on the insulating layer using the composition of the present invention.

The invention claimed is:

1. A method for manufacturing a semiconductor device, comprising the steps of:
  applying a composition for forming a coating film to surfaces of an insulating layer and a wiring layer containing copper on a substrate on which the insulating layer and the wiring layer are formed;
  baking the composition at temperature of 200-300° ° C. to form a coating film on the surfaces of the insulating layer and the wiring layer of the substrate; and then
  selectively removing the coating film on the wiring layer using water, so that the coating film remains on the insulating layer and prevents diffusion of the copper of the wiring layer into the insulating layer, wherein the insulating layer i) contains $SiO_2$ as a principal component or ii) contains porous silica as a principal component and has a silanol residue derived from the porous silica on a surface thereof,
wherein the composition for forming a coating film comprises:
(a) a polymer comprising a structural unit represented by the following formula (1a); and
(b) a solvent containing 5 to 25% by weight of at least one organic solvent selected from the group consisting of propylene glycol monomethyl ether and propylene glycol monomethyl ether acetate and 75 to 95% by weight of water:

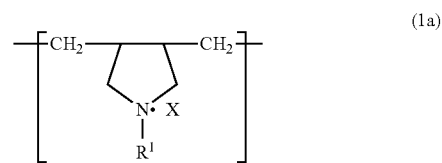

wherein X is sulfamic acid, and R1 is a hydrogen atom or a methyl group,
wherein the composition is suitable for forming said coating film on a surface of said insulating layer and said wiring layer containing copper on said substrate by baking the composition on the substrate to form the coating film for preventing diffusion of the copper of the wiring layer into the insulating layer, and
wherein the polymer further comprises a structural unit represented by the following formula (2):

2. The method for manufacturing a semiconductor device according to claim 1, wherein the (b) solvent comprises 10 to 20% by weight of the at least one organic solvent and 80 to 90% by weight of water.

3. The method for manufacturing a semiconductor device according to claim 1, wherein the (b) solvent comprises the propylene glycol monomethyl ether.

* * * * *